United States Patent [19]

Taft

[11] Patent Number: 5,736,857
[45] Date of Patent: Apr. 7, 1998

[54] METHOD AND APPARATUS FOR REALISTIC PRESENTATION OF INTERPOLATED MAGNETIC RESONANCE IMAGES

[75] Inventor: Jeffrey David Taft, Cranberry Township, Pa.

[73] Assignee: Micro Signal Corporation, Cranberry Township, Pa.

[21] Appl. No.: 561,393

[22] Filed: Nov. 21, 1995

[51] Int. Cl.$^6$ ............................................. G01V 3/00
[52] U.S. Cl. ............................ 324/309; 364/413.18
[58] Field of Search ........................... 324/309, 307, 324/306, 312, 314, 300; 128/653.2; 364/413.18, 413.22, 723

[56] References Cited

U.S. PATENT DOCUMENTS

| | | | |
|---|---|---|---|
| 4,876,509 | 10/1989 | Perlmutter | 324/309 |
| 4,982,328 | 1/1991 | Kasugai | 324/309 |
| 5,498,961 | 3/1996 | Kuhn et al. | 324/309 |
| 5,513,120 | 4/1996 | Berlad | 364/413.18 |

OTHER PUBLICATIONS

Castleman, Kenneth R., "Digital Image Processing," Prentice–Hall (1979), pp. 293–298.

Gonzalez, R. C. & Wintz, Paul, "Digital Image Processing," Addison–Wesley (1977), pp. 136–139, 182, 333–338, 387.

*Primary Examiner*—Louis M. Arana

[57] ABSTRACT

A method and apparatus for processing medical magnetic resonance imaging (MRI) images of successive parallel slices of tissue and displaying them sequentially so that the transition from one image to the next appears smooth. Consecutive pairs of scanned images are used to produce additional, interpolated images to increase the apparent number of slices and decrease the apparent distance between them. The interpolated images, which lack certain visual properties of the original images, particularly graininess due to noise, are then transformed by a digital filter to restore the lost properties. The transformed images are interleaved with the original images to form a new sequence which appears smooth when viewed in order, thereby aiding a physician in mentally visualizing structures of interest in the images.

17 Claims, 5 Drawing Sheets

METHOD AND APPARATUS FOR REALISTIC PRESENTATION OF INTERPOLATED MAGNETIC RESONANCE IMAGES

BACKGROUND OF THE INVENTION

1. Field of the Invention

This invention relates to a method of processing a sequence of two-dimensional magnetic resonance (MRI) images for display to a physician as an aid in visualizing human tissues. The method operates on a sequence of original images obtain by MRI scanning. The original images, representing successive slices of tissue, are augmented by interpolated images that have been filtered so that their texture approximates that of the original images. When the original images and filtered interpolated images are interleaved and displayed in sequence on a computer display, a smooth visual presentation results, assisting the physician in viewing the MRI images and appreciating the anatomy and physiology the images signify.

2. Description of the Prior Art

Magnetic resonance imaging (MRI) is a valued non-invasive diagnostic medical technique that permits the examination and viewing of a patient's internal body tissues. In MRI scanning, a portion of the patient's body is exposed to a strong spatially varying magnetic field, causing the protons in the tissues to align themselves in the magnetic field. Short pulses of radio frequency (RF) energy are emitted into the tissues being examined. This causes a temporary disturbance in the bulk magnetization of the tissues. After the pulse has decayed, the protons realign themselves in the magnetic field, emitting RF signals as they do so. The signals, which are indicative of proton density in the area of tissue from which they were emitted, are detected and transformed into a two-dimensional black and white (gray scale) image. MRI permits an image to be made of a planar section of the human body in a non-invasive way. An MRI device may be utilized to produce a sequence of planar image sections representing parallel "slices" through human tissue.

It is usual for each MRI slice to be printed as an image on transparent photographic film having the appearance of an x-ray. A physician then views the slices side by side and attempts to visualize mentally the three-dimensional appearance of various body structures that are of concern, such as ligaments, blood vessels, tumors and the like. A drawback of this method of viewing slices is that the physician must move his eyes and head from side to side and/or up and down significantly to view a set of images, making it very difficult for him to correlate an observed portion of a structure on one image with the same portion on other images, because successive images are not presented to the physician in the same spatial location.

Methods are known in the prior art to ameliorate this problem by displaying successive slices as black and white images on a computer display screen. In this fashion, the images are each displayed one at a time in the same physical location, eliminating the need for motion of the physician's head. Unfortunately, in this method, slices can only be displayed singly and the physician is unable to compare two slices without having to remember one of them.

A partial solution to the single display problem is to permit single MRI images to be viewed sequentially in rapid succession. The viewing can be so rapid as to simulate the appearance of actually moving through the human body, which is a valuable tool for the physician in visualizing tissues and making a diagnosis. It is known in the art to provide an input device, such as a computer mouse, joystick or trackball to allow the physician, by physical movement of the device, to select a particular image for viewing and to step rapidly through the images. However, the physical distance between successive MRI slices in a human subject is typically in the range of 2–10 millimeters. This distance is sufficiently great that successive displayed slice images can be jarringly different, even when displayed in the same physical space and properly registered. It is not feasible to scan more slices while the patient is in the magnetic field because the time required for scanning increases linearly with the number of slices desired. It is both expensive and uncomfortable for the patient to increase the number of slices scanned. It is also not physically possible, because of the characteristics of MRI devices, to decrease the width, and hence the spacing, of the slices. The effect on the physician of successively viewing slices that differ substantially in appearance is that he has trouble following the same body structure from one slice to the next, which interferes with his diagnostic capability.

It is a drawback of prior art MRI display techniques, therefore, that a continuous sequence of scan images cannot be viewed in a way that the transition between successive images is smooth.

It is an object of the present invention to provide smooth continuous viewing of prestored MRI images and to reduce the discontinuity between images of successive MRI slices.

SUMMARY OF THE INVENTION

Accordingly, I have invented a computer system that operates on prestored MRI images to prepare them for display upon a computer screen. The initial MRI images (herein "original images") are obtained by prior art MRI scanners. Each original image is processed by prior art techniques to yield a single digital picture composed of a rectangular array of integer grayscale values. Suppose the number of original images in a sequence to be s. The next step of my invention is to form interpolated digital pictures between every pair of consecutive original images. In the case where just a single interpolant is produced for each consecutive pair of original images, the number of interpolated images will be s−1, yielding a total of 2s−1 original plus interpolated images.

As a result of the interpolation process, the interpolated images do not exhibit the same texture properties as the original images and are not directly suitable for display. If raw generated images are displayed to a physician, he is able to see readily that they are not original and this phenomenon detracts from rather than enhancing the act of viewing the images to form a diagnosis. It is therefore necessary to process the generated images further to make them appear to have the save visual and texture characteristics of the original images.

Each interpolated image is subjected to a numerical convolution process (yielding a "generated image"). In one embodiment of the invention, the convolution is performed by operating on each interpolated image with a 3-by-3 non-recursive digital filter. The coefficients of the digital filter are selected to give the generated images noise properties similar to those of the original images, which causes the generated images to exhibit visual and texture properties similar to those of the original images.

The generated images are then suitable for viewing by a physician because (1) as a result of the interpolation process, he will not be visually distracted by discontinuities in successive images; and (2) as a result of the filtration process, he will not be visually distracted by obvious visual differences between the original images and the generated images sandwiched between the original images.

DETAILED DESCRIPTION OF THE INVENTION

Figure 1:
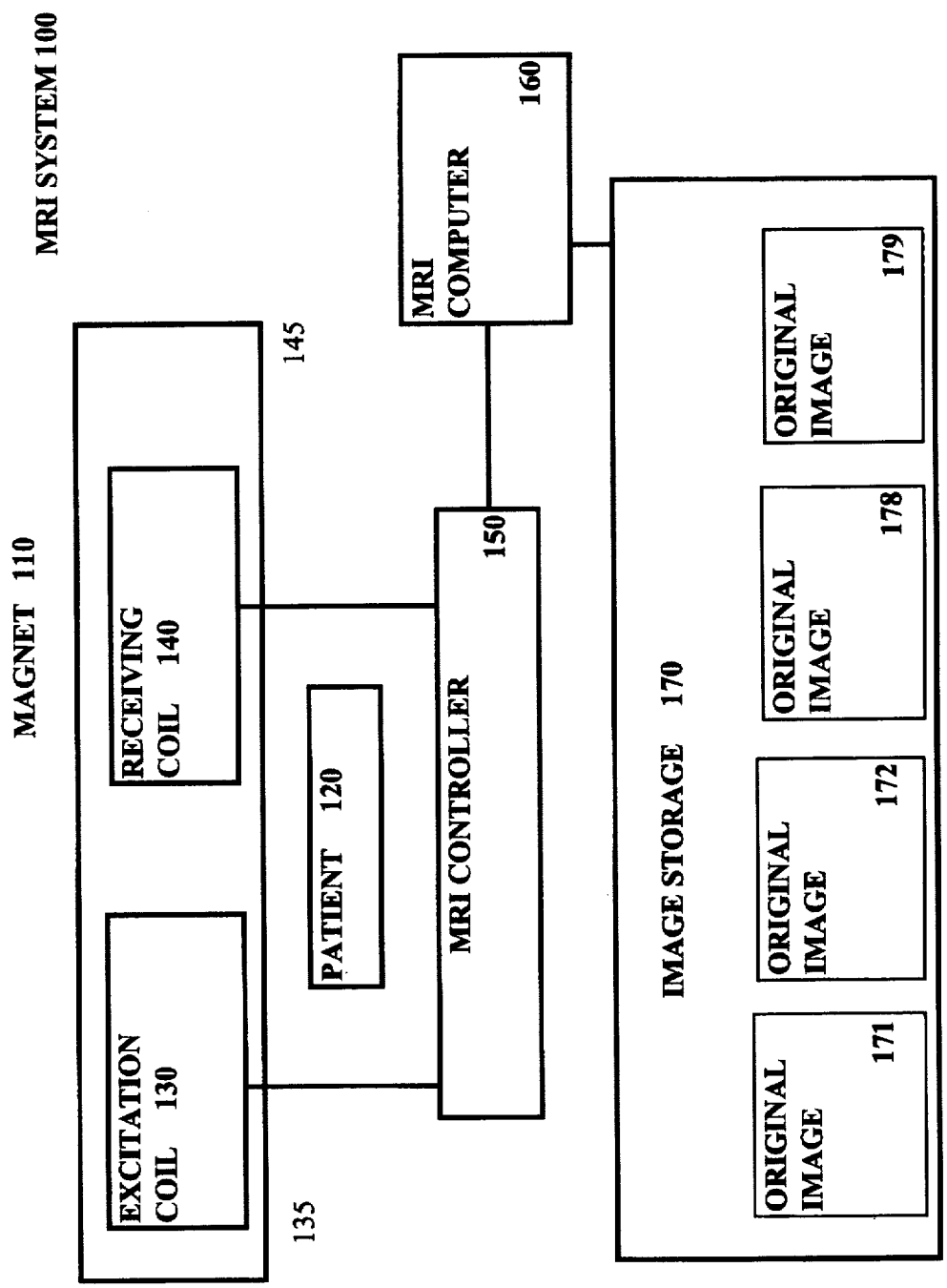
FIG. 1 shows a block diagram of a prior art MRI system that produces images of successive tissue slices and stores them on a computer storage device.

FIG. 1 shows a prior art MRI system 100 capable of producing and storing a sequence of digitized original images on a storage medium, such sequence being composed of views of successive parallel slices of tissue. A patient 110 to be examined is placed inside a magnet 120. Present inside magnet 120 is an excitation coil 130 and a receiving coil 140. Excitation coil 130 is used to emit pulses to disturb the orientation of protons in the tissues of patient 110. Receiving coil 140 is used to receive RF signals emitted by the protons after decay of each pulse. Excitation coil 130 is connected electrically by means of electrical cable 135 to an MRI controller 150 that contains electrical circuitry to drive the excitation coil 130, receive signals from receiving coil 140, perform analog-to-digital conversion of signals and other conventional MRI functions. Receiving coil 140 is connected electrically to MRI controller 150 by means of electrical cable 145. MRI controller 150 is connected electrically to MRI computer 160, which performs digital computations on data received from MRI controller 150 to yield a sequence of original digital grayscale images. MRI computer 160 is connected electrically to image storage 170. Image storage 170 is typically a magnetic hard disk storage unit that may have either permanent or removable disks. A first original digital image 171 in a sequence, a second original digital image 172 in a sequence, a next-to-last original digital image 178 and a last original digital image 179 in a sequence are stored on image storage 170. It is to be understood that original digital images between said second image and said last image are also stored on image storage 170 but are not shown in FIG. 1. The total number of original images intended to be represented by the four exemplars 171, 172, 178 and 179 is denoted herein by the quantity s.

As a preliminary step in the process of the present invention, the prior art MRI system 100 is employed to obtain a sequence of original digital images 171, 172, 178 and 179 stored on image storage 170. The ordering of the images produced by MRI system 100 represent views of adjacent parallel slices of tissue of patient 110.

Figure 2:
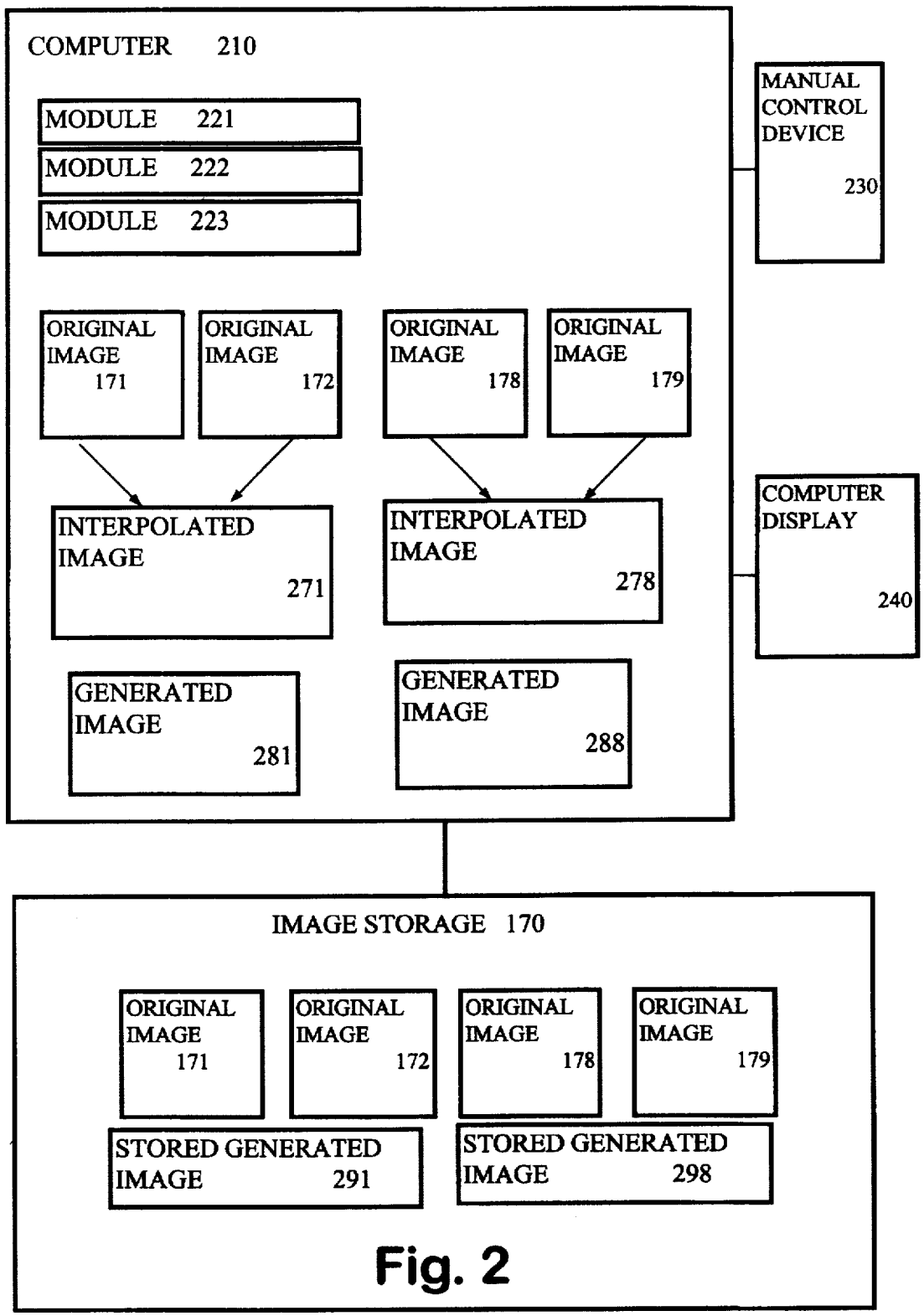
FIG. 2 shows a computer system for manipulating, storing and displaying MRI images according to the present invention.

FIG. 2 depicts the apparatus of the present invention. A computer 210 is electrically connected to image storage 170 on which are stored a sequence of original digital images 171, 172 and 179. Computer 210 may optionally be the same or a different physical device from MRI computer 160. Resident in the memory of computer 210 is computer program 220, which is composed of three modules 221, 222 and 223. Module 221 takes as input consecutive pairs of original digital images and produces interpolated images. For example, module 221 operates on images 171 and 172 to produce interpolated image 271. Interpolated image 271 is resident after its formation in the random-access memory portion of computer 210. It is then necessary to transform interpolated image 271 to form generated image 281 having visual properties similar to those of original image 171. Module 222 is a computer program that performs the transformation. Digital image 271, while resident in the memory of computer 210, is operated upon by module 222 to yield generated image 281, which is then stored on image storage 170 as stored generated image 291. The steps of interpolating and transforming images are repeated for each consecutive pair of original images. The next-to-last and last original images 178 and 179 are interpolated by module 221 to produce interpolated image 278. Interpolated image 278 is transformed by module 222 to produce generated image 288, which is stored on image storage 170 as stored generated image 298. It is to be understood that first stored generated image 291 and last stored generated image 298 are merely the first and last representatives of a sequence containing an arbitrary number of such stored generated images.

Manual control device 230 and computer display 240 are connected electrically to computer 210. Manual control device 230 may be a computer mouse, joystick, trackball, or any other device that is able to sense changes in physical positioning. It is used to provide input to computer 210 to control the display on computer display 240 of stored original images 171 through 179 and stored generated images 291 through 298. Module 223 controls the display of images based on the physical position of control device 230. Moving control device 230 permits the physician user to scroll through the stored images at any desired speed by moving the control device 230. Module 223 senses the position of control device 230 and selects an appropriate image for display based on the sensed position. The display is created by conventional means on display 240.

Figure 3:
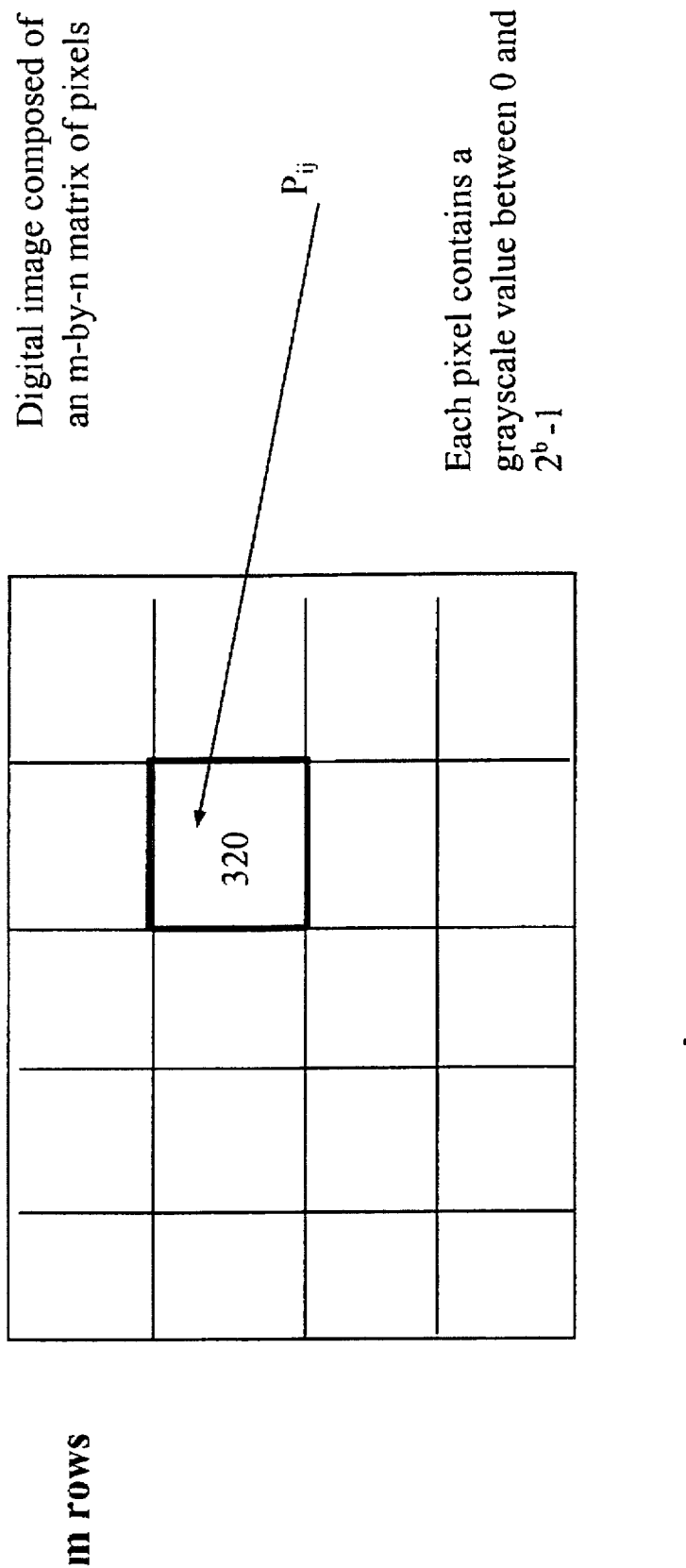
FIG. 3 shows a digitized MRI image stored as a matrix of numbers representing grayscale values as used in the present invention.

FIG. 3 shows a digital image 310 as it is represented in the memory of computer 210. The digitized image 310 is composed of a plurality of pixels 320 conventionally arranged in the form of a grayscale matrix having m rows and n columns. Each entry of the matrix corresponds to a pixel of the image and contains a representation of a non-negative integer in the range 0 to 2 b−1, where b is the number of bits used to encode a number and     denotes the exponentiation operator. For digitized MRI images, typically m and n are in the range of 256–512, with m=n and b is in the range 8–16. For example, a common MRI image would be represented as a 256-by-256 square matrix with values in the range 0–4095. A pixel value of 0 denotes full blackness, while a pixel having a maximum value of 2 b−1 represents white. Pixel values in between black and white represent shades of gray. Digitized image 310 corresponds to the r-th original image out of a sequence of s original images. The quantity $P^{(r)}_{ij}$ is the numerical grayscale value of the pixel in row i and column j of the r-th original image.

Figure 4:
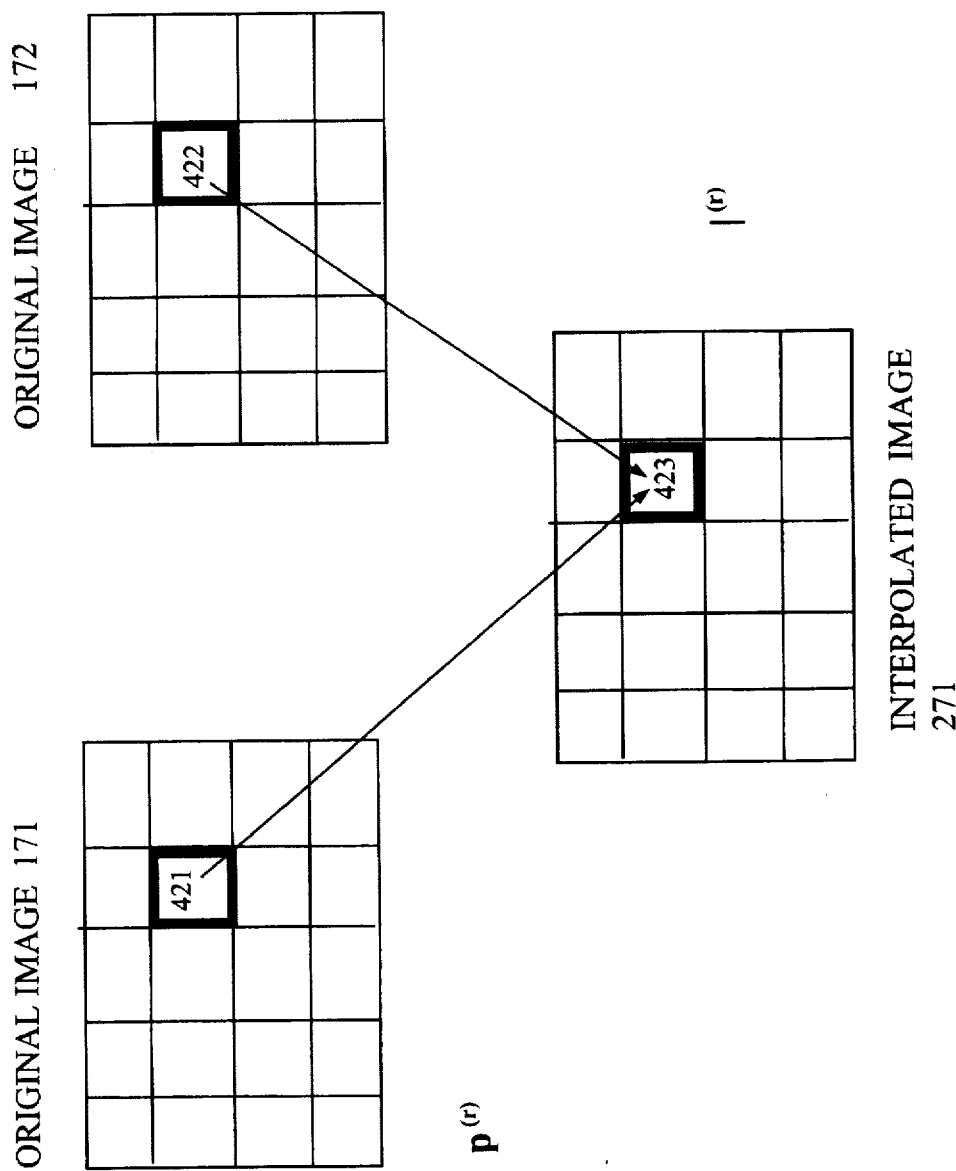
FIG. 4 shows the formation of an interpolated image from two successive original images according to the present invention.

FIG. 4 shows one embodiment of the interpolation process to produce an r-th interpolated image between the r-th and the (r+1)-th original images in the special case where only one interpolated image is to be created for each pair of successive original images. The quantity $I^{(r)}_{ij}$ is the numerical grayscale value of the pixel 423 in row i and column j of the r-th interpolated image. It is computed for all i and j in the appropriate range for each pixel 421 of the r-th original image, whose value is denoted by $P^{(r)}_{ij}$, and each pixel 422 of the (r+1)-th original image, whose value is denoted by $P^{(r+1)}_{ij}$, using weights a and (1–a), where $0 \leq a \leq 1$. If it is intended that the r-th interpolated image represent a hypothetical slice lying midway in distance between the r-th and (r+1)-th original images, then a value of a=½ would be used. The r-th interpolated image is formed by using the equation $$I^{(r)}_{ij} = (a)P^{(r)}_{ij} + (1-a)P^{(r+1)}_{ij} \quad \text{(Eq. 1)}$$

for all i in the range $1 \leq i \leq m$ and all j in the range $1 \leq j \leq n$ to compute all pixel values $I^{(r)}_{ij}$. In FIG. 4, original images 171 and 172 are interpolated to form interpolated image 271. In actual computer implementation, since pixel values must be integers, the computed values must be rounded but must not exceed $2^b-1$. If an interpolated image is not intended to lie midway between two successive slices, but lies, for example, one-third of the distance between the r-th and the (r+1)-th original image, then a would be taken to have the value ⅓.

It was observed, however, when interpolated images were prepared according to Eq. 1, interleaved with original images and displayed to physicians, the physicians were able to distinguish the interpolated images from the original images in a majority of cases. The reason is believed to be that since the operation of interpolation is known to act as a low-pass filter, the noise that is present in original images is filtered out to some degree from the interpolated images which therefore appear to have a different texture from the original images. This difference in texture is easily observable upon viewing both the original and interpolated images. It is therefore desirable to re-introduce a degree of noise into the interpolated images so that they exhibit approximately the same granularity as the original images. This observation conflicts with the usual goal of digital image processing, which is to enhance features and eliminate the effects of noise wherever possible. However, the interpolated images have no features to enhance that are not also present in the original images, since the interpolated images are derived entirely from the original images.

Figure 5:
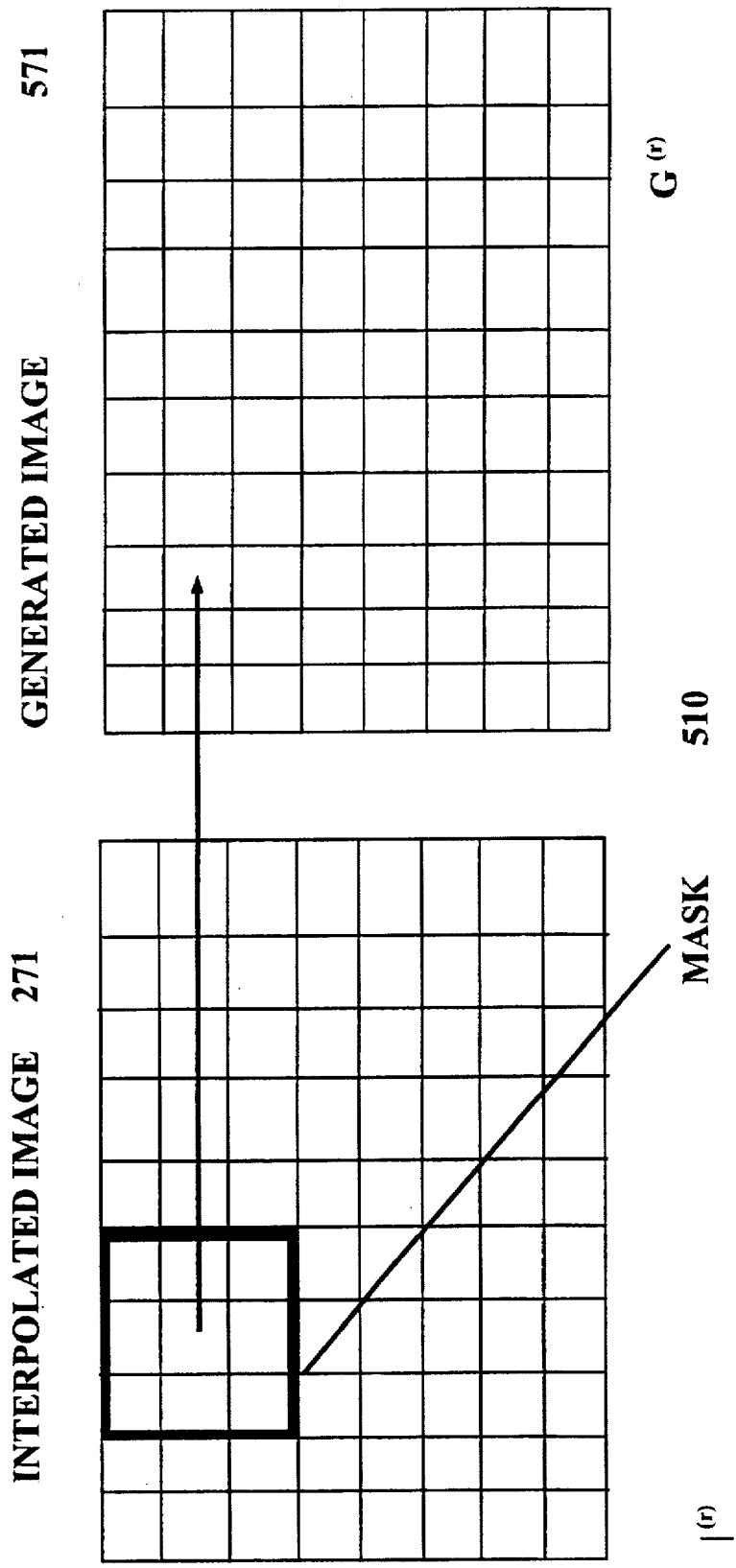
FIG. 5 shows digital filtration of an interpolated image according to the present invention to restore visual characteristics lost during interpolation.

The method of the present invention for re-introducing noise is to alter the value of each pixel of each interpolated image (except pixels lying on the four edges of the interpolated image, which are not altered) by applying a nine-point operator. The edge pixels need not be altered because the subject matter of interest in an MRI image is positioned toward the center of the image and does not lie on the boundary. FIG. 5 shows a detail of the pixels $I^{(1)}_{ij}$ of the first interpolated image 271. It is desired to form the pixels $G^{(1)}_{ij}$ of a first generated image 281 derived from interpolated image 271. The 3-by-3 square mask 510 centered about pixel $I^{(1)}_{ij}$ shows the nine pixel values that will be used to compute the generated pixel value $G^{(1)}_{ij}$. This is done in general for the r-th generated image by computing pixel values according to the equation:

$$G^{(r)}_{ij} = \sum_{p=-1}^{1} \sum_{q=-1}^{1} h_{pq} I^{(r)}_{i+p-2, j+q-2}, \quad \text{(Eq. 2)}$$

$$2 \leq i \leq m-1, 2 \leq j \leq n-1$$

where the nine coefficients $h_{pq}$ may be arbitrary numbers the sum of whose values equals +1. After the values $G^{(r)}_{ij}$ are computed according to Eq. 2, each value must be clipped to ensure that it lies in the range between 0 and $2^b-1$ to constitute a valid grayscale value. Any value below zero is reset to zero. Any value above $2^b-1$ is reset to $2+e\text{.cir} + ee$ $b-1$.

It is possible to visualize the filtering process as one in which the square mask 510 is moved across the rows of an interpolated image and used to generate successive pixels of a generated image. The particular coefficients $h_{pq}$ are chosen to yield effective results. Experimentation with MRI images shows that taking $h_{22}=+1.8$ and giving the other eight coefficients the value $-0.1$ achieves textures similar to those of the original images so that physicians experienced in reading MRI images do not notice the difference between original and generated images. It is believed that the particular coefficients that would be chosen in an application other than MRI would depend on the autocorrelation function of the noise in the original images. If the sum of the coefficients $h_{pq}$ does not equal 1, the undesirable effect will be to alter the overall brightness of the generated image.

After each generated image is produced in the memory of computer 210, it is stored as an array on image storage 170. After processing the set of s original images, the total number of images stored in image storage 170 and available for display is 2s–1, composed of s original images and s–1 generated images, referred to collectively as the "display images". It will be appreciated in the foregoing that the image storage accessed by computer 210 need not be the same physical device on which the original images produced by MRI computer 160 are stored, but that said original images could be transferred by conventional means to a different image storage device prior to production of the generated images. Likewise, once the generated images have been produced by the process of the present invention, they may be transferred to a computer system different from computer system 210 for subsequent display.

Display of the display images 171, 291, 172, 178, 298, 179 in a manner convenient to physicians is performed by module 223. A one-dimensional visual indicator having two endpoints, such as a slide bar or other movable representation of distance, is displayed on computer display 240. The displayed position of the visual indicator is related to the sensed position of manual control device 230. One endpoint of the range of the visual indicator is intended to correspond to the first display image; the other endpoint corresponds to the last display image. By physically moving manual control device 230, the physician is able to select an individual display image for display on computer display 240. By moving the manual control device 230 smoothly along its direction of travel, successive display images are displayed. The physician uses such motion to move back and forth through the sequence of display images to form his diagnosis.

The production of interpolated images and their subsequent transformation according to the present invention need not be performed on a programmable digital computer, but can easily be implemented directly in electronic circuitry embodying the calculations of Eq. 1 and Eq. 2.

It will be understood by those familiar with the art of digital picture processing that the method and apparatus of the present invention have utility that is not confined to the processing and display of MRI images, but apply generally to any sequence of digital images representing successive views parametrized by a single parameter such as spatial distance or time in which it is desired to produce interpolated images that match the original images in some characteristic, such as texture, contrast or noisiness. The low-pass filtration property of linear interpolation affects each of these characteristics. For example, in the process of digital morphing, which is the transformation of one image into another in minute discrete steps so that the transformation appears continuous when the images are viewed consecutively, the present invention may be applied to generate intermediate images. In military radar applications, an image is presented to the viewer showing the space swept by the radar beam at discrete time intervals. It can be difficult to track an object moving through the space scanned by the radar of the object moves in discrete steps. It is therefore useful to provide interpolated images, which may be processed by the method of the present invention to match a visual characteristic of the original images.

It is believed that the present invention operates by restoring noise to the interpolated images that has been lost in the interpolation process. MRI images are inherently noisy due to many physical factors, including stray RF radiation in the environment and characteristics of the emission and receiving equipment in the MRI scanner. Noise appears in MRI images as isolated pixels or combinations of pixels that deviate from their "true" value. Interpolation reduces the magnitude of noise as follows. Suppose that the first original image contains an abnormally dark pixel (noise) at coordinates (i,j) and that the second original image contains a similar dark pixel not at the same location but at the nearby coordinates (i+3,j+5). If the noise is random, one would not expect two consecutive images to have noise pixels at the same coordinates. When an interpolant is formed from the first and second original images with parameter a=½, the contrast (difference in grayscale) between a noise pixel and its surrounding environment will be cut in half. The noise will therefore no longer appear as pronounced in the interpolated image as it did in either of the original images. It is believed that this phenomenon causes interpolated images to be recognized by physicians as not being part of the set of original images.

A general discussion of noise in digital images and algebraic techniques for representing it appear in Castleman, Kenneth R., *Digital Image Processing*, Englewood Cliffs, N.J.: Prentice-Hall (1979), ISBN 0-13-212365-7. The prior art deals primarily with methods of eliminating noise, not restoring it.

The purpose of applying a nine-point operator of Eq. 2 with the indicated coefficients is to enhance noise. A pixel whose grayscale value differs from that of its surrounding environment (that is, its eight neighbor pixels) will be transformed by Eq. 2 into a pixel whose grayscale value is even farther from that of the surrounding environment. The coefficients $h_{pq}$ were chosen to give a satisfactory match between interpolated and original MRI images.

It will be evident to those skilled in the art that the invention is not limited to the details of the foregoing illustrative embodiment and that the present invention may be embodied in other specific forms without departing from the spirit or essential attributes thereof. The present embodiments are therefore to be considered in all respects as illustrative and not restrictive, the scope of the invention being indicated by the appended claims and rather than by the foregoing description and all changes which come within the meaning and range of the equivalency of the claims are therefore intended to be embraced therein.

In the following claims, the term "digital image" means a representation in pixel values of a visual image stored in a computer memory. The term "interpolated digital image" means a digital image formed from two original digital images by performing numerical interpolation on a pixel-by-pixel basis. The term "numerical quality function" means a function defined on the pixel values of a digital image. For example, but without limiting the intended scope of the definition, a numerical quality function can be brightness, texture, focus, contrast, or noise level. "Displaying," a digital image means the physical step of transforming the pixel values of the digital image to electrical signals and using said signals to produce a visible representation of the digital image on a display medium. Without limiting the foregoing definition, such display media may include computer screens, LED and LCD displays, laser printers, facsimile machines, photographic film and x-ray film. "Noise discrepancy" means a numerical measure of the difference in noise levels between two digital images. To say that "image A exhibits a noise discrepancy with image B" means that the noise levels of images A and B are different, said difference being the value of said noise discrepancy. "Medical scanning apparatus" means a device for producing digital images representing tissue. Without limiting the foregoing definition, medical scanning apparatus includes X-ray machines, MRI scanners and CAT scanners.

I claim:

1. A method of displaying a sequence of at least two given digital images, a numerical quality function, yielding a quality value defined on the digital images, comprising the steps of:

a) generating at least one interpolated digital image from a pair of consecutive given digital images of the sequence, said pair having a first image and a second image; and b) transforming at least one said interpolated digital image to yield a transformed image, wherein a quality value of said transformed image is greater than or equal to a quality value of said interpolated digital image; and c) displaying in order said first image, said transformed image, and said second image.

2. The method of claim 1, comprising the additional step of:

d) repeating steps a) through c) for all pairs of consecutive given digital images.

3. The method of claims 1 or 2, wherein said interpolated digital image is formed by linear interpolation and said transforming is performed by applying to said interpolated digital image a digital filter.

4. The method of claims 1 or 2, wherein said interpolated digital image is formed by linear interpolation and said transforming is performed by applying to said interpolated digital image a digital filter defined by the nine-point matrix:

$$\begin{vmatrix} -a & -a & -a \\ -a & 1+8a & -a \\ -a & -a & -a \end{vmatrix}$$

where a is a positive number between 0 and 1.

5. A method of displaying a sequence of at least two given digital images, said images, comprising the steps of:

a) generating at least one interpolated digital image from a pair of consecutive given digital images of the sequence, said pair having a first image and a second image, said interpolated digital image exhibiting a first noise discrepancy with a given digital image; and b) transforming at least one said interpolated digital image to yield a transformed image exhibiting a second noise discrepancy with a given digital image, wherein said second noise discrepancy is less than said first noise discrepancy;

c) displaying in order said first image, said transformed image, and said second image.

6. The method of claim 5, comprising the additional step of:
   d) repeating steps a) through c) for all pairs of consecutive given digital images.

7. The method of claims 5 or 6, wherein said interpolated digital image is formed by linear interpolation and said transforming is performed by applying to said interpolated digital image a digital filter.

8. The method of claims 5 or 6, wherein said interpolated digital image is formed by linear interpolation and said transforming is performed by applying to said interpolated digital image a digital filter defined by the nine-point matrix:

$$\begin{vmatrix} -a & -a & -a \\ -a & 1+8a & -a \\ -a & -a & -a \end{vmatrix}$$

where a is a positive number between 0 and 1.

9. A method of displaying a sequence of digital medical images of tissue, comprising the steps of:
   a) operating a medical scanning apparatus to produce, in sequence, scanned digital images of successive parallel slices of the tissue;
   b) storing said scanned digital images in a computer memory;
   c) forming an interpolated image for at least one pair of successive scanned digital images;
   d) transforming said interpolated image to form a transformed image wherein a noise discrepancy between said transformed image and a scanned digital image is lower than a noise discrepancy between said interpolated image and a scanned digital image.

10. A method for improving the display of a sequence of at least two given digital images, comprising the steps of:
   a) generating at least one interpolated digital image for each pair of consecutive given digital images of the sequence, each such pair having a first image and a second image;
   b) transforming each said interpolated digital image to yield a transformed image, whereby a noise discrepancy between said transformed image and a given digital image is lower than a noise discrepancy between said interpolated digital image and a given digital image;
   c) producing an augmented display sequence by interleaving said transformed images between the pairs of given digital images from which said transformed images were generated; and
   d) displaying said augmented display sequence.

11. An apparatus for processing digital images comprising
   a) storage means for storing and retrieving the digital images;
   b) computer means for generating interpolated digital images;
   c) computer means for transforming said interpolated digital images to alter a numerical quality function of said interpolated digital images to yield transformed images;
   d) computer means for storing said transformed images in said storage means;
   e) digital image display means; and
   f) computer means for controlling an order of presentation of the images stored in said storage means.

12. In an MRI imaging apparatus that produces a sequence of at least two digital images, an improvement comprising:
   a) means for generating at least one interpolated digital image from a pair of consecutive digital images of the sequence, said pair having a first image and a second image;
   b) means for transforming said interpolated digital image to yield a transformed image; and
   c) means for displaying in order said first image, said transformed image and said second image.

13. The apparatus of claim 12, wherein said transforming means comprises means for reducing a noise discrepancy between said interpolated digital image and an image of said pair to a value lower than a noise discrepancy between said interpolated digital image and an image of said pair.

14. The apparatus of claim 13, wherein said transforming means comprises a digital filter.

15. The apparatus of claim 14, wherein said digital filter is defined by the nine-point matrix:

$$\begin{vmatrix} -a & -a & -a \\ -a & 1+8a & -a \\ -a & -a & -a \end{vmatrix}$$

where a is a positive number between 0 and 1.

16. A computer system for displaying a sequence of digital medical images representing successive tissue slices comprising:
   a) means for receiving and storing the images;
   b) means for producing interpolated digital images from pairs of the images;
   c) means for transforming the interpolated digital images into transformed images, wherein a wherein a quality value of a numerical quality function of said transformed images is greater than or equal to a quality value of a numerical quality function of said interpolated digital images; and
   d) means for displaying sequences having, in alternating order, images and transformed images.

17. The system of claim 16, wherein all said means are programmed computer elements, said transforming means comprises a digital filter and said quality value is indicative of noise, said digital filter of the form:

$$\begin{vmatrix} -a & -a & -a \\ -a & 1+8a & -a \\ -a & -a & -a \end{vmatrix}$$

where a is a positive number between 0 and 1.

* * * * *

UNITED STATES PATENT AND TRADEMARK OFFICE
CERTIFICATE OF CORRECTION

PATENT NO. : 5,736,857
DATED : April 7, 1998
INVENTOR(S) : Jeffrey David Taft

It is certified that error appears in the above-identified patent and that said Letters Patent is hereby corrected as shown below:

Column 4 Line 51 "$\hat{2}$b-1" should read --$2^{\wedge}$b-1--.

Column 4 Line 52 "an$\hat{d}$" should read --and $^{\wedge}$ --.

Column 4 Line 58 "of $\hat{2}$" should read --of $2^{\wedge}$--.

Column 5 Line 7 "$P^{(r+1)})_{ij}$" should read --$P^{(r+1)}{}_{ij}$--.

Column 5 Line 19 "2 $\hat{b}$-1" should read --$2^{\wedge}$b-1--.

Column 5 Line 60 "$G^{(r)}{}_{ij}$" should read --$G^{(r)}{}_{ij}$--.

Column 5 Line 60 "$I^{(r)}{}_{i+p}$" should read --$I^{(r)}{}_{i+p}$--.

Column 5 Line 67 "$\hat{2}$ b-1" should read --$2^{\wedge}$b-1--.

Column 6 Line 2 "$\hat{2}$ b-1" should read --$2^{\wedge}$b-1--.

Column 6 Lines 2-3 "2+e,cir +ee b-1" should read --$2^{\wedge}$b-1--.

Signed and Sealed this

Eleventh Day of August 1998

*Attest:*

BRUCE LEHMAN

*Attesting Officer*  *Commissioner of Patents and Trademarks*